United States Patent
Kang

(10) Patent No.: US 7,602,659 B2
(45) Date of Patent: Oct. 13, 2009

(54) MEMORY DEVICE HAVING SHARED FAIL-REPAIRING CIRCUIT CAPABLE OF REPAIRING ROW OR COLUMN FAILS IN MEMORY CELL ARRAYS OF MEMORY BANKS

(75) Inventor: Sang Hee Kang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/965,550

(22) Filed: Oct. 14, 2004

(65) Prior Publication Data

US 2005/0243617 A1 Nov. 3, 2005

(30) Foreign Application Priority Data

Apr. 28, 2004 (KR) .................. 10-2004-0029592

(51) Int. Cl.
*G11C 7/00* (2006.01)
(52) U.S. Cl. .................... 365/200; 365/225.7
(58) Field of Classification Search ................. 365/200, 365/225.7, 233.03, 233.5, 189.07
See application file for complete search history.

(56) References Cited

U.S. PATENT DOCUMENTS

| | | | | |
|---|---|---|---|---|
| 6,388,941 B2 * | 5/2002 | Otori et al. ............. | 365/230.08 |
| 6,434,064 B2 * | 8/2002 | Nagai .................... | 365/200 |
| 6,621,750 B2 * | 9/2003 | Okuyama et al. ........... | 365/200 |
| 6,920,057 B2 * | 7/2005 | Honda et al. ............. | 365/51 |
| 6,928,008 B2 * | 8/2005 | Lee et al. ............... | 365/200 |
| 6,944,074 B2 * | 9/2005 | Chung et al. ............. | 365/200 |

FOREIGN PATENT DOCUMENTS

| | | |
|---|---|---|
| JP | 63-206998 A | 8/1988 |
| JP | 04-113600 A | 4/1992 |
| JP | 05-028792 A | 2/1993 |
| JP | 06-076591 A | 3/1994 |
| JP | 06-267292 A | 9/1994 |
| JP | 2000-509182 A | 7/2000 |
| JP | 2001-014885 A | 1/2001 |
| JP | 2001-067892 A | 3/2001 |
| JP | 2001-273789 A | 10/2001 |
| JP | 2002-015593 A | 1/2002 |
| JP | 2002-074981 A | 3/2002 |
| JP | 2003-132674 A | 5/2003 |
| JP | 2004-039680 A | 2/2004 |
| KR | 20010057382 | 7/2001 |

* cited by examiner

*Primary Examiner*—Gene N. Auduong
(74) *Attorney, Agent, or Firm*—Ladas & Parry LLP

(57) ABSTRACT

A memory device sharing a fail-repairing part is disclosed. The memory device has a plurality of banks that share a fuse and control unit for repairing a row fail or column fail in memory cell arrays in the respective banks. The memory device has reduced size and improved repair efficiency.

15 Claims, 6 Drawing Sheets

MEMORY DEVICE HAVING SHARED FAIL-REPAIRING CIRCUIT CAPABLE OF REPAIRING ROW OR COLUMN FAILS IN MEMORY CELL ARRAYS OF MEMORY BANKS

BACKGROUND OF THE INVENTION

1. Field of the Invention

The present invention relates to a memory device that shares circuit construction for repairing fail, and more particularly to a memory device that makes respective memory banks share a fail-repairing circuit installed outside the memory banks instead of installing separate fail-repairing circuits in the memory banks, respectively.

2. Description of the Prior Art

With the high integration of a semiconductor memory device, the number of memory cells packaged on a chip becomes greatly increased. However, in spite of the development of fabrication technology of a high-integration memory device, there is always a probability of fail occurrence in memory cells or word/bit lines. Such a probability becomes higher as the integration of a memory device becomes higher.

Meanwhile, the memory device is also required to operate at a high frequency. As the speed of the memory device becomes high, a bank structure has been proposed. For example; 2, 4, 8 or 16 banks are provided inside the memory device. In particular, the bank structure is generally used in a synchronous type DRAM such as a DDR SDRAM.

In relation to the fail of a memory device, a memory device adopting a bank structure is provided with repair-related circuits installed in the respective banks. These repair-related circuits in the respective banks repair the fail if the fail occurs in the corresponding banks.

FIG. 1 shows the construction of banks of a conventional memory device that include repair circuits. In FIG. 1, the conventional memory device is composed of four banks, and signals and functions of constituent elements of the construction of FIG. 1 will briefly be explained.

The term "address" represents a row address or a column address commonly applied to all memory banks.

The term "bank address" represents an address for selecting a specified bank among a plurality of banks 101 to 104.

The term "command" represents a signal for setting an inner operation of the memory device such as active, pre-charge, read, write, etc.

The term "bank control unit" represents a circuit for instructing a specified bank designated by the bank address to perform an operation set by the command. For example, if a bank 102 is selected by the bank address and a write command is applied to the bank control unit 10, the bank control unit 10 controls a write operation of the bank 102.

The terms "A0, A1, A2 and A3" serve to input/release an effective address to/from a bank selected by the bank control unit 10.

The bank 101 includes an address latch 11, a pre-decoder 12, a fuse and control unit 13, a decoder and block control unit 14 and a memory cell array 15.

The address latch 11 holds the address for a predetermined time.

The pre-decoder 12 pre-decodes the address B0 outputted from the address latch 11.

The address C0 outputted from the pre-decoder is applied to the fuse and control unit 13 and the decoder and block control unit 14.

The fuse and control unit 13 cures the fail occurring in a specified memory cell. The fuse and control unit 13 determines whether to repair the input address by comparing repair information stored in a fuse with the address, and outputs a redundancy operation signal D0 for the repair.

If the input address is a normal address as a result of comparison, the decoder and block control unit 14 receives the address C0 and accesses the corresponding specified cell of the memory cell array 15. In this case, the specified cell represents a normal cell. However, if the input address is a fail address, the decoder and block control unit 14 receives the address D0 and accesses the corresponding specified cell of the memory cell array 15. In this case, the specified cell represents a redundancy cell.

The structures of the banks 102, 103 and 104 are the same as that of the bank 101.

FIG. 2 shows the construction of banks of another conventional memory device that include repair circuits.

The construction of FIG. 2 is different from that of FIG. 1 such that the address B0 outputted from the address latch is directly applied to the fuse and control unit. Specifically, the fuse and control unit 13 of FIG. 1 receives the output of the pre-decoder 12, but the fuse and control unit of FIG. 2 directly receives the output of the address latch.

The remaining construction of FIG. 2 is the same as that of FIG. 1.

As shown in FIGS. 1 and 2, in the conventional memory device, the respective banks have the corresponding fuse and control units provided inside the banks, and thus the repairing circuits of the conventional memory device have the disadvantages in size and efficiency.

Specifically, in spite of the great development of fabrication technology, the fail cells are not produced at constant rates with respect to the respective banks. For example, in some banks, many fail cells may be produced, while in other banks, a few or almost no fail cell may be produced. Since the rates of fail cell production are different by banks, it is inefficient to provide the constant number of fuse and control units by banks. Also, in the case of the specified banks in which a few fail cells are produced, the fuse and control units unnecessarily occupy a large space.

SUMMARY OF THE INVENTION

Accordingly, the present invention has been made to solve the above-mentioned problems occurring in the prior art, and an object of the present invention is to provide a memory device that can make all memory banks provided in the memory device share a fail-repairing circuit.

Another object of the present invention is to provide a memory device that can keep the repair efficiency even as it uses a minimum number of fuses.

Still another object of the present invention is to provide a memory device that can make two or more banks share a fail-repairing circuit by making it possible to select addresses inputted to the fuses according to two or more bank addresses.

In order to accomplish these objects, there is provided a memory device having a plurality of banks that share a fuse and control unit for repairing a row fail or column fail in memory cell arrays in the respective banks.

In another aspect of the present invention, there is provided a memory device comprising a fuse and control unit for receiving an address, a bank address and a refresh signal, a bank control unit for receiving the bank address and a command, and a plurality of banks for respectively receiving the address, output signals of the fuse and control unit and output signals of the bank control unit, wherein the plurality of banks share the fuse and control unit.

It is preferable that the respective bank comprises an address latch for receiving the address and the output signal of the bank control unit, a hit latch for receiving the output signal of the fuse and control unit, a pre-decoder for receiving an output signal of the address latch, a decoder and control unit for receiving an output signal of the pre-decoder and an output signal of the hit latch, and a memory cell array for receiving an output signal of the decoder and control unit.

It is preferable that the fuse and control unit comprises a fuse set for receiving the address, a bank fuse and decoder for receiving the bank address and the refresh signal, and a bank selection unit for receiving an output signal of the fuse set and an output signal of the bank fuse and decoder.

It is preferable that the fuse set comprises a fuse unit for storing a fail address and a comparator for checking whether the input address coincides with the fail address stored in the fuse unit by comparing the input address with the fail address, and decides only whether to repair the received address.

It is preferable that the bank fuse and decoder comprises a fuse unit for storing the fail address and the bank address, a comparing unit for checking whether the bank address stored in the fuse unit coincides with the input bank address by comparing the bank address stored in the fuse unit with the input bank address and means for outputting bank information stored in the fuse unit irrespective of the bank address during a refresh operation, and functions to decide whether to repair the input bank address and designate a bank to be repaired.

It is preferable that the bank selection unit selects a specified bank according to an output signal of the bank fuse and decoder and transfers that the currently inputted address is a repaired one if the address applied to the fuse set coincides with the address stored in the fuse unit and the bank address applied to the bank fuse and decoder coincides with the bank address stored in the fuse unit of the bank fuse and decoder.

In still another aspect of the present invention, there is provided a memory device comprising a fuse and control unit for receiving an internal address and a bank address, a bank control unit for receiving the bank address and a command, and a plurality of banks for respectively receiving the address, output signals of the fuse and control unit and output signals of the bank control unit, wherein the plurality of banks share the fuse and control unit.

It is preferable that the respective bank comprises an address latch for receiving the address and the output signal of the bank control unit, a pre-decoder for receiving an output signal of the address latch, a decoder and control unit for receiving an output signal of the pre-decoder and the output signal of the fuse and control unit, and a memory cell array for receiving an output signal of the decoder and control unit.

It is preferable that the fuse and control unit comprises an address selection unit for receiving the internal address and outputting the internal address in response to a specified control signal, a fuse set for receiving the output signal of the address selection unit, a bank fuse and decoder for receiving the bank address and outputting the control signal, and a bank selection unit for receiving an output signal of the fuse set and the control signal.

It is preferable that the fuse set comprises a fuse unit for storing a fail address and a comparator for checking whether the input address coincides with the fail address stored in the fuse unit by comparing the input address with the fail address, and decides only whether to repair the received address.

It is preferable that the bank fuse and decoder comprises a fuse unit for storing the fail address and the bank address, a comparing unit for checking whether the bank address stored in the fuse unit coincides with the input bank address by comparing the bank address stored in the fuse unit with the input bank address and means for outputting bank information stored in the fuse unit irrespective of the bank address during a refresh operation, and functions to decide whether to repair the input bank address and designate a bank to be repaired.

It is preferable that the bank selection unit selects a specified bank according to an output signal of the bank fuse and decoder and transfers that the currently inputted address is a repaired one if the address applied to the fuse set coincides with the address stored in the fuse unit and the bank address applied to the bank fuse and decoder coincides with the bank address stored in the fuse unit of the bank fuse and decoder.

Preferably, the internal address is a signal outputted from the address latch.

Preferably, the internal address is a signal outputted from the pre-decoder.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
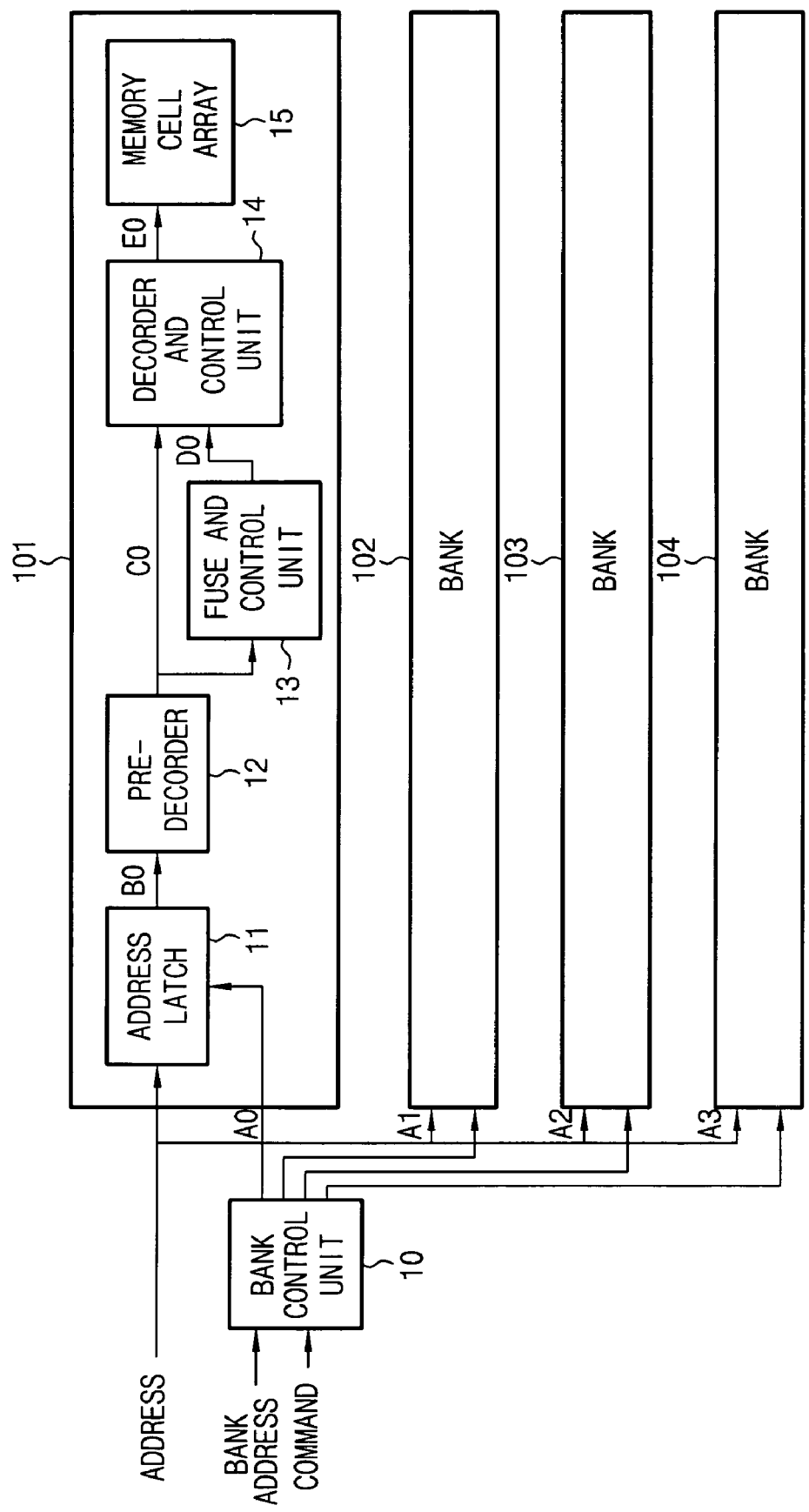
FIG. 1 is a block diagram illustrating the construction of banks of a conventional memory device that include repair circuits.
Figure 2:
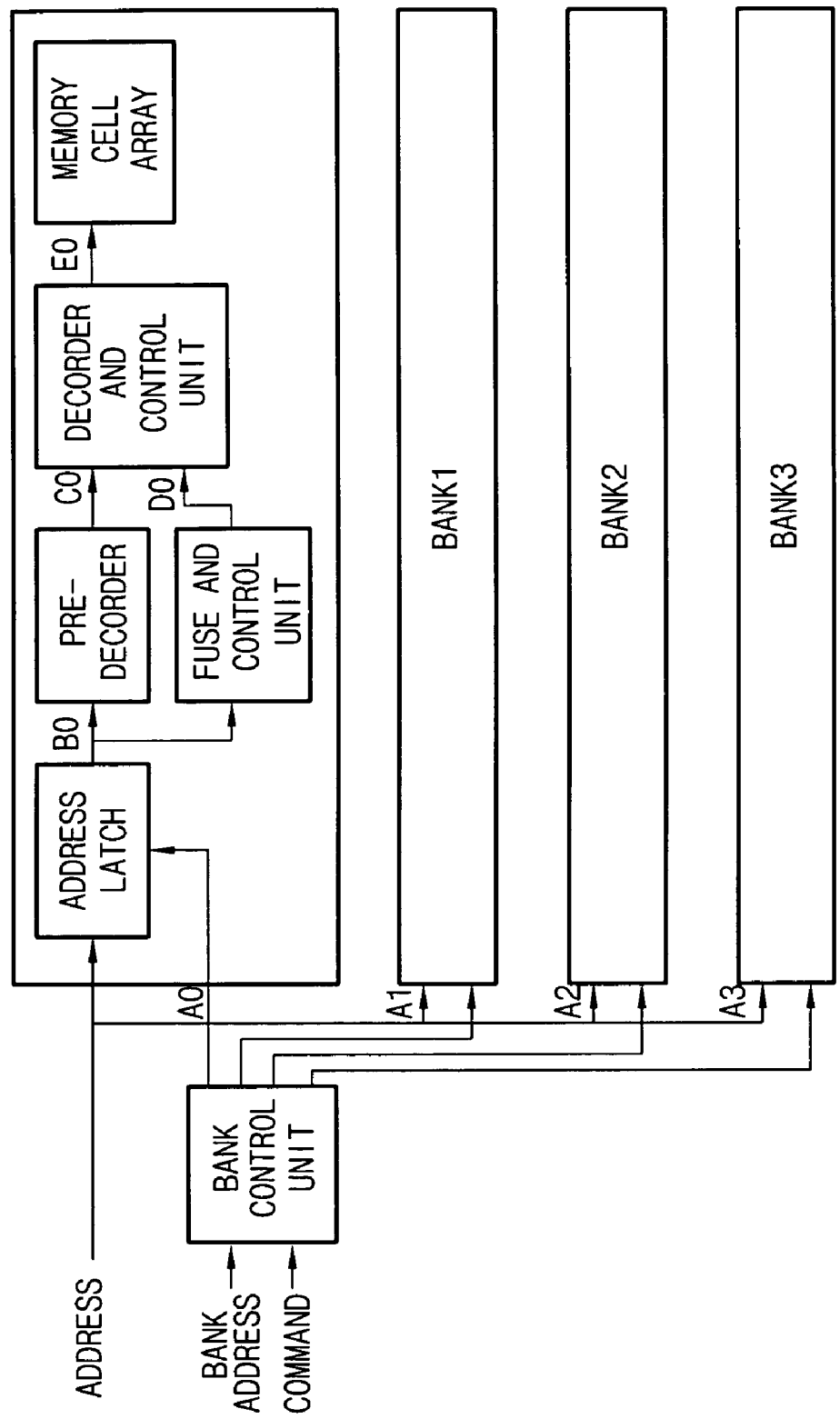
FIG. 2 is a block diagram illustrating the construction of banks of another conventional memory device that include repair circuits.

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 3:
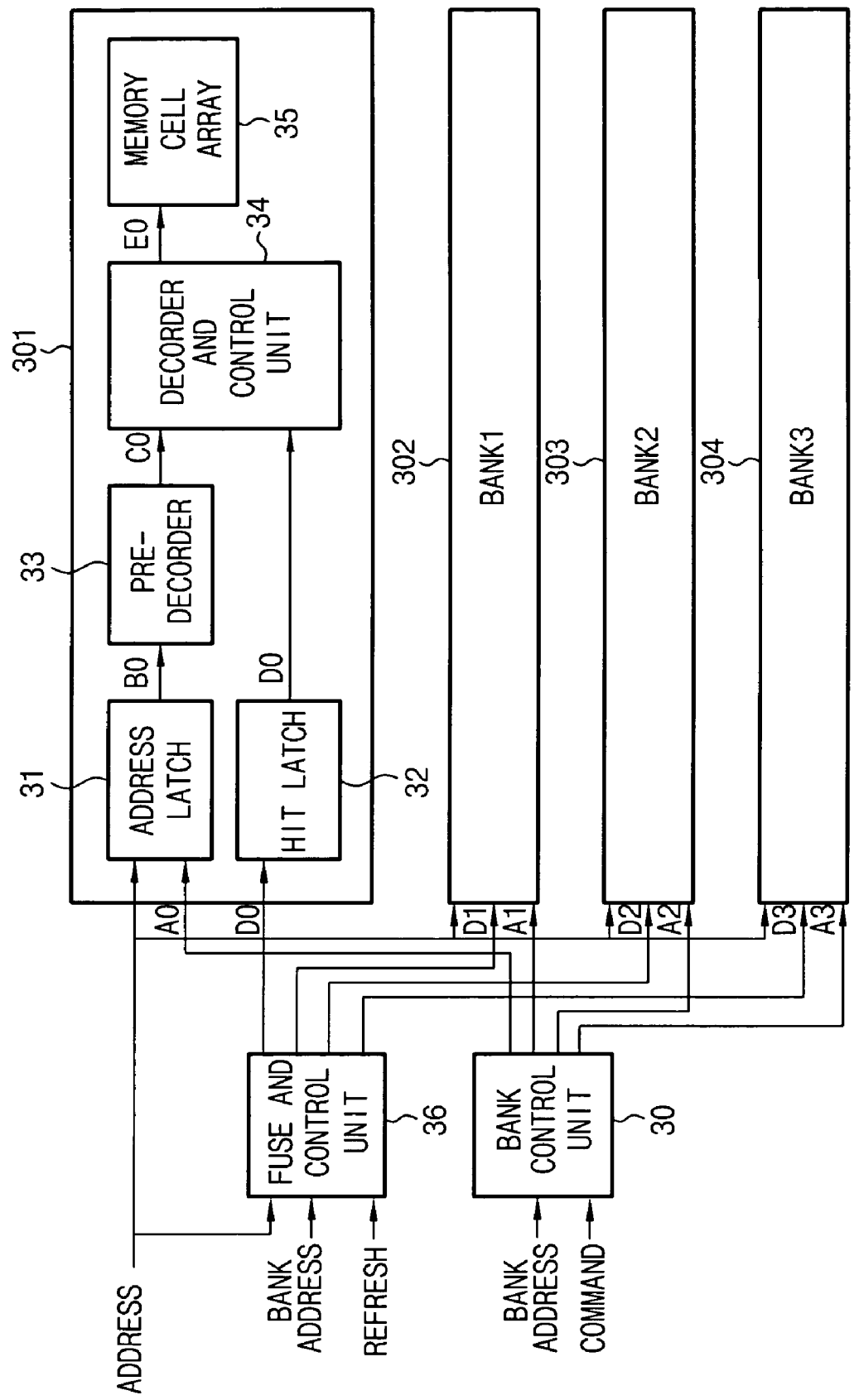
FIG. 3 is a block diagram illustrating the construction of banks of a memory device that include repair circuits according to an embodiment of the present invention.

FIG. 3 is a block diagram illustrating the construction of banks of a memory device that include repair circuits according to an embodiment of the present invention. In FIG. 3, a plurality of banks (i.e., four banks) share a fuse and control unit.

The memory device of FIG. 3 includes a fuse and control unit 36 for receiving an address, a bank address and a refresh signal, a bank control unit 30 for receiving the bank address and a command, and a plurality of banks 301$m$ 302$m$ 303 and 304 for respectively receiving the address, output signals of the fuse and control unit 36 and output signals of the bank control unit 30, so that the banks 301, 302, 303 and 304 share the fuse and control unit 36.

The address that represents a column address or row address is commonly applied to all the banks 301, 302, 303 and 304.

The fuse and control unit 36 for repairing a row fail or column fail of a memory cell array 35 receives the address, bank address and refresh signal. The fuse and control unit 36 basically stores repair address and redundancy information, and functions to compare the row and column address applied from an outside with the stored repair address. Output signals D0, D1, D2 and D3 of the fuse and control unit 36 are applied to the corresponding banks 301, 302, 303 and 304, respectively. The construction and operation of the fuse and control unit 36 will be explained later with reference to FIG. 4.

The bank control unit 30 receives the bank address and the command signal and transfers commands such as active, precharge, read, write, etc., to a selected specified bank. Output signals A0, A1, A2 and A3 of the bank control unit 30 are applied to the corresponding banks 301, 302, 303 and 304, respectively.

The bank 301 includes an address latch 31 for receiving the address and the bank address that is the output signal of the bank control unit, a hit latch 32 for receiving the output signal D0 of the fuse and control unit 36, a pre-decoder 33 for receiving an output signal B0 of the address latch 31, a decoder and control unit 34 for receiving an output signal C0 of the pre-decoder 33 and the output signal D0 of the hit latch 32, and a memory cell array 35 for receiving an output signal E0 of the decoder and control unit 34.

The address latch 31 receives and latches the address. The address B0 outputted from the address latch 31 is pre-decoded by the pre-decoder 33 and then applied to the decoder and control unit 34.

The hit latch 32 latches and transfers the output signal D0 of the fuse and control unit 36 to the decoder and control unit 34 during an active operation, but is kept in a reset state during a pre-charge operation.

The decoder and control unit 34 outputs the address E0 for designating a selected specified memory cell.

The constructions of the remaining banks 302, 303 and 304 are the same as the construction of the bank 301, and thus the detailed explanation thereof will be omitted.

Figure 4:
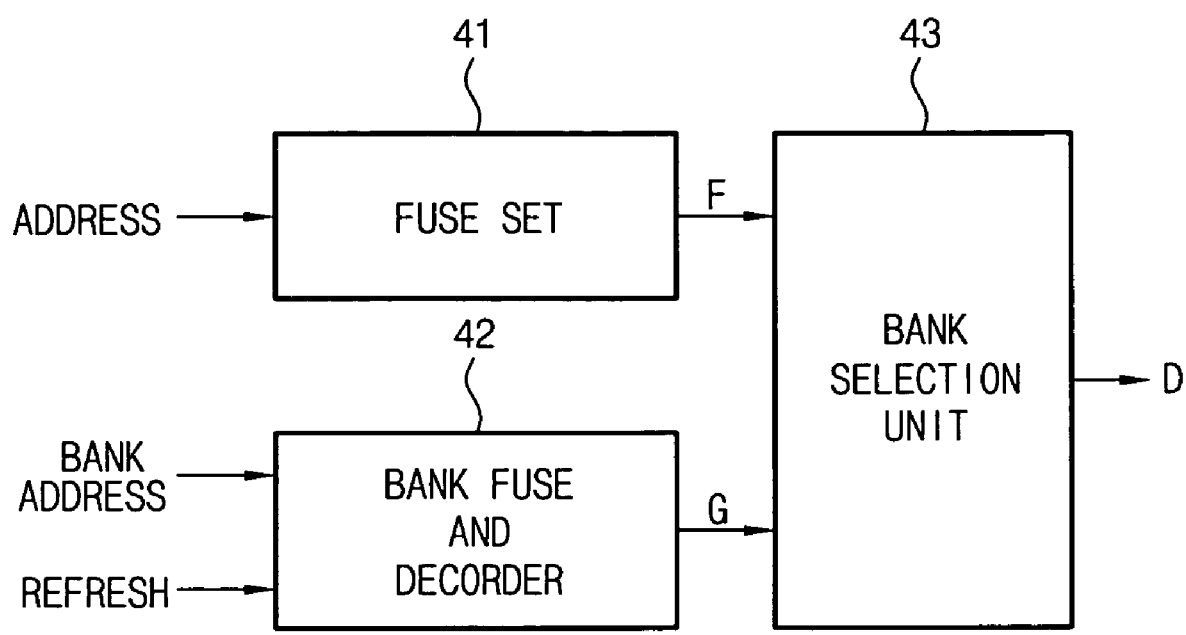
FIG. 4 is a block diagram illustrating the construction of a fuse and control unit as illustrated in FIG. 3.

FIG. 4 is a block diagram illustrating the construction of the fuse and control unit 36 as illustrated in FIG. 3.

The fuse and control unit 36 as illustrated in FIG. 4 includes a fuse set 41, a bank fuse and decoder 42 and a bank selection unit 43.

The fuse set 41 receives the address and decides only whether to repair the address. For this, the fuse set includes a fuse unit (not illustrated) for storing a fail address and a comparator (not illustrated) for checking whether the input address coincides with the fail address stored in the fuse unit by comparing the input address with the fail address.

The bank fuse and decoder 42 for receiving the bank address and the refresh signal has a function of designating a bank to be repaired in addition to the function of deciding whether to repair the inputted bank address. Here, the refresh signal is for refreshing all the banks irrespective of the bank address during a refresh operation. For this, the bank fuse and decoder 42 includes a fuse unit for storing the fail address and the bank address, a comparing unit for checking whether the bank address stored in the fuse unit coincides with the input bank address by comparing the bank address stored in the fuse unit with the input bank address and a circuit for outputting the bank information stored in the fuse unit irrespective of the bank address during the refresh operation.

The bank selection unit 43 receives an output signal F of the fuse set 41 and an output signal G of the bank fuse and decoder 42.

If the address applied to the fuse set 41 coincides with the address stored in the fuse unit of the fuse set 41 and the bank address applied to the bank fuse and decoder 42 coincides with the bank address stored in the fuse unit of the bank fuse and decoder 42, the bank selection unit 43 selects a specified bank according to the output signal G of the bank fuse and decoder 42 and transfers that the currently inputted address is a repaired one.

As shown in FIGS. 3 and 4, the memory device according to the present invention is constructed so that all the banks 301 to 304 share the fuse and control unit 36. Accordingly, the memory device according to the present invention has a reduced size in comparison to the conventional memory device as it has the same function and repair efficiency as the conventional memory device.

Figure 5:
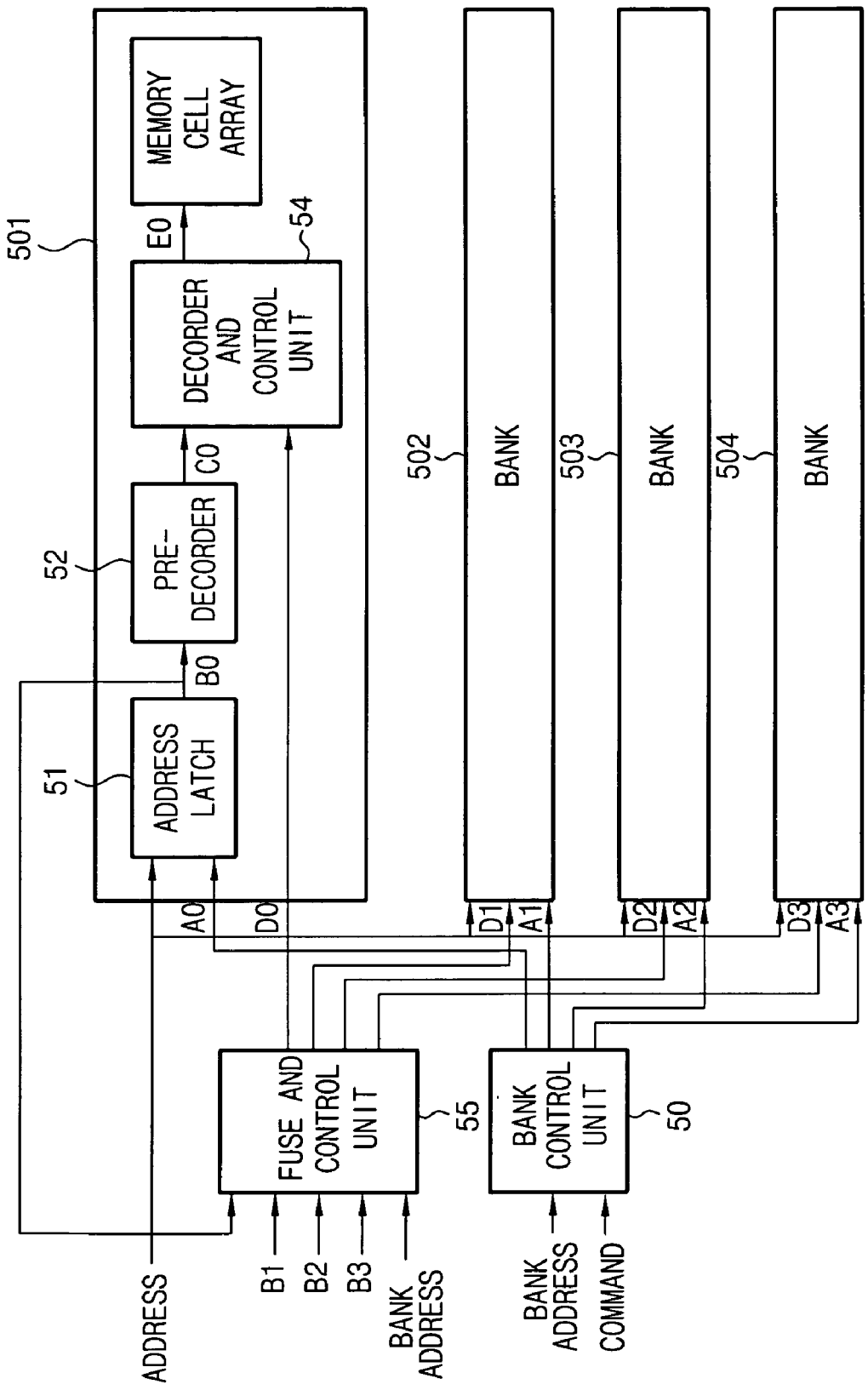
FIG. 5 is a block diagram illustrating the construction of banks of a memory device that include repair circuits according to another embodiment of the present invention.

FIG. 5 is a block diagram illustrating the construction of banks of a memory device that include repair circuits according to another embodiment of the present invention.

The memory device of FIG. 5 includes a fuse and control unit 55 for receiving an internal address and a bank address, a bank control unit 50 for receiving the bank address and a command, and a plurality of banks 501, 502, 503 and 504 for respectively receiving the address, output signals of the fuse and control unit 55 and output signals of the bank control unit 50, so that the banks 501, 502, 503 and 504 share the fuse and control unit 55. Here, the memory device of FIG. 5 is not provided with the hit latch 32 as shown in FIG. 3. Although FIG. 5 shows that the internal address is implemented by the output signal of the address latch of the respective bank, it should be recognized that the internal address may be implemented using the output signal of the pre-decoder 52.

The bank 501 includes an address latch 51 for receiving the address and the output signal A0 of the bank control unit 50, a pre-decoder 52 for receiving an output signal B0 of the address latch 51, a decoder and control unit 53 for receiving an output signal C0 of the pre-decoder 52 and the output signal D0 of the fuse and control unit 55, and a memory cell array 54 for receiving an output signal E0 of the decoder and control unit 53.

The address latch 51 receives and latches the address. The address B0 outputted from the address latch 51 is pre-decoded by the pre-decoder 52 and then applied to the decoder and control unit 53. Also, the output signal B0 of the address latch 51 is outputted to the fuse and control unit 55.

The decoder and control unit 53 outputs the address E0 for designating a specified memory cell of the memory cell array 54.

The constructions of the remaining banks 502, 503 and 504 are the same as the construction of the bank 501, and thus the detailed explanation thereof will be omitted.

In FIG. 5, the address B0 applied to the fuse and control unit 55 is an address outputted from the address latch 51 of the bank 501 and the address B1 is an address outputted from the address latch of the bank 502. Also, the address B2 is an address outputted from the address latch of the bank 503 and the address B3 is an address outputted from the address latch of the bank 504.

In FIG. 5, the address that represents the column address or row address is commonly applied to all the banks 501, 502, 503 and 504.

Unlike the fuse and control unit 36 of FIG. 3, the fuse and control unit 55 of FIG. 5 receives the bank address and addresses B0 to B3 outputted from the address latches of the respective banks. Although the address B0 to B3 to be inputted to the fuse and control unit 55 are provided from the address latches in the embodiment of the present invention, it should be recognized that they may be provided from the pre-decoder.

Although the fuse and control unit 36 of FIG. 3 directly receives the address signal, the fuse and control unit 55 of FIG. 5 receives the address signal outputted from the address latch of the respective bank that has received the address signal.

Output signals D0, D1, D2 and D3 of the fuse and control unit 55 for repairing the row fail or column fail of the memory cell array are applied to the corresponding banks 501, 502, 503 and 504, respectively.

The bank control unit 50 receives the bank address and the command signal and transfers commands such as active, precharge, read, write, etc., to a selected specified bank. Output signals A0, A1, A2 and A3 of the bank control unit 50 are applied to the corresponding banks 501, 502, 503 and 504, respectively.

Figure 6:
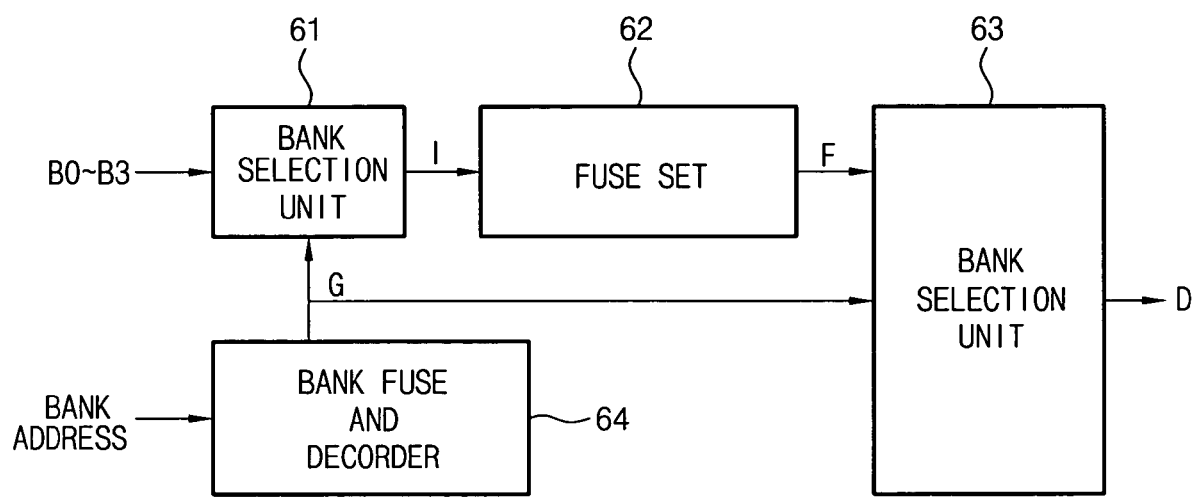
FIG. 6 is a block diagram illustrating the construction of a fuse and control unit as illustrated in FIG. 5.

FIG. 6 is a block diagram illustrating the construction of the fuse and control unit 55 as illustrated in FIG. 5.

The fuse and control unit of FIG. 6 includes an address selection unit 61, a fuse set 62, a bank selection unit 63 and a bank fuse and decoder 64.

The address selection unit 61 that is controlled by an output signal G of the bank fuse and decoder 64 receives addresses B0 to B3. The address selection unit 61 provides an output signal I to the fuse set 62 so that the fuse set 62 operates in association with bank information.

The fuse set 62 receives the address outputted from the address selection unit 61 and decides whether to repair the address in the same manner as the fuse set 41 of FIG. 4.

The bank fuse and decoder 64 that has received the bank address signal decides whether to repair the input bank address in the same manner as the bank fuse and decoder 42 of FIG. 4.

The bank selection unit 63 receives an output signal F of the fuse set 62 and the output signal G of the bank fuse and decoder 64 in the same manner as the bank selection unit 43 of FIG. 4.

As shown in FIGS. 5 and 6, the memory device according to the present invention is constructed so that all the banks 501 to 504 share the fuse and control unit 55. Accordingly, the memory device according to the present invention has a reduced size in comparison to the conventional memory device as it has the same function and repair efficiency as the conventional memory device.

Hereinafter, the effect of the present invention will be explained in comparison to that of the conventional memory device.

First, the effect of the conventional memory device is as follows:

The fuse and control unit 13 of the conventional memory device as shown in FIG. 1 includes a plurality of fuses for storing fail addresses, and thus a circuit for one address set is constructed in a state that the circuit the output of which is determined according to the cutting/non-cutting of the fuses is considered as a minimum unit. Accordingly, when one address set is inputted, the output of the fuse and control unit is determined according to the coincidence of the addresses. Here, the coincidence of the addresses is called a hit.

Since fuses for 16 to 32 address sets are arranged for one bank, 16 to 32 fuse sets exist. It is general that the respective fuse set is associated with a specified redundancy circuit in the memory cell array. Accordingly, the fuse and control unit 13 of FIG. 1 compares the input address with the fail address recorded in the respective fuse set, and determines whether to operate the redundancy circuit or a normal circuit by combining outputs of the whole fuse sets if the state of the output signal is determined according to the coincidence of the addresses. If the redundancy circuit should be operated, the fuse and control unit 13 transfers a specified control signal to the decoder and control unit 14 so that the decoder and control unit 14 can access the redundancy associated with the hit fuse set. According to the conventional memory device of FIG. 1, the fuse and control unit 13 is provided for every bank, and no fuse or circuit for the bank address is used.

BY contrast, the memory device according to the present invention has the following characteristics:

1. The fuse and control unit is not dependent on any specified bank. That is, all the banks share the fuse and control unit. Accordingly, a bank control unit for giving the bank information to the address sets is provided.
2. In the present invention, there is no redundancy that is associated with a fuse set in a bank in advance, i.e., the fuse sets and the associated redundancy circuits are not provided by banks, and thus means for associating the fuse set with the redundancy is used.
3. In the present invention, wiring for connecting the redundancy with the fuse and control unit for each bank is required.
4. The respective bank is provided with means for receiving and latching for an active period the output signals of the fuse and control unit when the corresponding bank is activated.
5. The present invention is provided with an apparatus (such as a fuse and control unit, etc.) for activating all the banks since all the banks are simultaneously activated during the refresh operation.

Through the above-described characteristics, the memory device according to the present invention can make four memory banks provided in the memory device share a fuse and control unit. Also, although in the embodiment of the present invention, it is exemplified that a fuse and control unit is shared by four banks, it will be apparent that a plurality of fuse and control units can also be shared by the memory banks.

As described above, the memory device according to the present invention makes the respective banks share a fuse and control unit that is a part for repairing the row fail or column fail, and thus the size of the memory device can be reduced with the repair efficiency maintained.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A memory device having a plurality of banks that share a fuse and control unit for repairing a row fail or column fail in memory cell arrays in the respective banks, wherein the fuse and control unit receives a bank address for designating one among the pluarality of banks and row and column addresses for designating memory cells of the respective bank, and stores repair addresses and redundancy addresses to provide alternative row or column address in the event of the row or column failure.

2. The memory device as claimed in claim 1, wherein the respective banks further share a bank control unit, and the bank control unit selects one among the plurality of banks and outputs a specified command to the selected bank.

3. The memory device as claimed in claim 1, wherein fuse and control unit has functions of storing the repair addresses and the redundancy addresses and comparing the row and column addresses with stored repair addresses.

4. A memory device comprising:
   a fuse and control unit for receiving an address, a bank address and a refresh signal;
   a bank control unit for receiving the bank address and a command; and
   a plurality of banks for respectively receiving the address, output signals of the fuse and control unit and output signals of the bank control unit;
   wherein the plurality of banks share the fuse and control unit for repairing a row fail or column fail in memory call arrays in the respective banks, wherein the fuse and control unit stores repair addresses and redundancy addresses to provide alternative row or column address in the event of the row or column failure, and
   wherein the fuse and control unit comprises:
   a fuse set for receiving the address;
   a bank fuse and decoder for receiving the bank address and the refresh signal; and
   a bank selection unit for receiving an output signal of the fuse set and an output signal of the bank fuse and decoder.

5. The memory device as claimed in claim 4, wherein the respective bank comprises:
   an address latch for receiving the address and the output signal of the bank control unit;
   a hit latch for receiving the output signal of the fuse and control unit;
   a pre-decoder for receiving an output signal of the address latch;
   a decoder and control unit for receiving an output signal of the pre-decoder and an output signal of the hit latch; and
   a memory cell array for receiving an output signal of the decoder and control unit.

6. The memory device as claimed in claim 4, wherein the fuse set comprises:
   a fuse unit for storing a fail address; and
   a comparator for checking whether the input address coincides with the fail address stored in the fuse unit by comparing the input address with the fail address;
   wherein the fuse set decides only whether to repair the received address.

7. The memory device as claimed in claim 6, wherein the bank fuse and decoder comprises:
   a fuse unit for storing the fail address and the bank address;
   a comparing unit for checking whether the bank address stored in the fuse unit coincides with the input bank address by comparing the bank address stored in the fuse unit with the input bank address; and
   means for outputting bank information stored in the fuse unit irrespective of the bank address during a refresh operation;
   wherein the bank fuse and decoder functions to decide whether to repair the input bank address and designate a bank to be repaired.

8. The memory device as claimed in claim 7, wherein the bank selection unit selects a specified bank according to an output signal of the bank fuse and decoder and transfers that the currently inputted address is a repaired one if the address applied to the fuse set coincides with the address stored in the fuse unit and the bank address applied to the bank fuse and decoder coincides with the bank address stored in the fuse unit of the bank fuse and decoder.

9. A memory device comprising:
   a fuse and control unit for receiving an internal address and a bank address;
   a bank control unit for receiving the bank address and a command; and
   a plurality of banks for respectively receiving the address, output signals of the fuse and control unit and output signals of the bank control unit;
   wherein the plurality of banks share the fuse and control unit for repairing a row fail or column fail in memory cell arrays in the respective banks by providing alternative row or column address in the event of the row or column failure, and wherein the internal address is a signal outputted and received from any one of the plurality of banks,
   wherein the fuse and control unit comprises:
   an address selection unit for receiving the internal address and outputting the Internal address in response to a specified control signal;
   a fuse set for receiving the output signal of the address selection unit;
   a bank fuse and decoder for receiving the bank address and outputting the control signal; and
   a bank selection unit for receiving an output signal of the fuse set and the control signal.

10. The memory device as claimed in claim 9, wherein the respective bank comprises: an address latch for receiving the address and the output signal of the bank control unit; a pre-decoder for receiving an output signal of the address-latch; a decoder and control unit for receiving an output signal of the pre-decoder and the output signal of the fuse and control unit; and a memory cell array for receiving an output signal of the decoder and control unit.

11. The memory device as claimed in claim 9, wherein the fuse set comprises: a fuse unit for storing a fail address; and a comparator for checking whether the input address coincides with the fail address stored in the fuse unit by comparing the input address with the fail address; wherein the fuse set decides only whether to repair the received address.

12. The memory device as claimed in claim 11, wherein the bank fuse and decoder comprises: a fuse unit for storing the fail address and the bank address; a comparing unit for checking whether the bank address stored in the fuse unit coincides with the input bank address by comparing the bank address stored in the fuse unit with the input bank address; and means for outputting bank information stored in the fuse unit irrespective of the bank address during a refresh operation; wherein the bank fuse and decoder functions to decide whether to repair the input bank address, and designate a bank to be repaired.

13. The memory device as claimed in claim 12, wherein the bank selection unit selects a specified bank according to an output signal of the bank fuse and decoder and transfers that the currently inputted address is a repaired one if the address applied to the fuse set coincides with the address stored in the fuse unit and the bank address applied to the bank fuse and decoder coincides with the bank address stored in the fuse unit of the bank fuse and decoder.

14. The memory device as claimed in any one of claims 10 and 11-13, wherein the internal address is a signal outputted from the address latch.

15. The memory device as claimed in any one of claims 10 and 11-13, wherein the internal address is a signal outputted from the pre-decoder.

* * * * *